(12) United States Patent
Lim (10) Patent No.: US 9,385,158 B2
(45) Date of Patent: Jul. 5, 2016

(54) BIPOLAR JUNCTION TRANSISTOR PIXEL CIRCUIT, DRIVING METHOD THEREOF, AND IMAGE SENSOR

(71) Applicant: PIXART IMAGING INC., Hsin-Chu (TW)

(72) Inventor: Wooi Kip Lim, Penang (MY)

(73) Assignee: PIXART IMAGING INC., Hsin-Chu (TW)

( * ) Notice: Subject to any disclaimer, the term of this patent is extended or adjusted under 35 U.S.C. 154(b) by 524 days.

(21) Appl. No.: 13/961,091

(22) Filed: Aug. 7, 2013

(65) Prior Publication Data

US 2015/0042566 A1 Feb. 12, 2015

(51) Int. Cl.
*H01J 40/14* (2006.01)
*H01L 27/146* (2006.01)
*G06F 3/03* (2006.01)
*G06F 3/0354* (2013.01)

(52) U.S. Cl.
CPC ........ *H01L 27/14681* (2013.01); *G06F 3/0304* (2013.01); *G06F 3/0317* (2013.01); *G06F 3/03543* (2013.01)

(58) Field of Classification Search
CPC .................................................. G06F 27/14681

USPC ........................................... 250/214 R, 214 A
See application file for complete search history.

(56) References Cited

U.S. PATENT DOCUMENTS

2005/0189476 A1* 9/2005 Kim .................. H01L 27/14603
250/214 R

* cited by examiner

*Primary Examiner* — Thanh Luu
(74) *Attorney, Agent, or Firm* — Li & Cai Intellectual Property (USA) Office (57) ABSTRACT

A bipolar junction transistor (BJT) pixel circuit, an image sensor and a driving method thereof are provided. The BJT pixel circuit includes a BJT, a photodetector, a feedback amplifier circuit, a shutter circuit, and a current generating unit. The photodetector generates a first base current to a base of the BJT responsive to a light incident on the photodetector. The feedback amplifier circuit is operative to increase an emitter voltage of the BJT according to the light intensity. The shutter circuit controls an exposure time of the photodetector according to a shutter signal. The current generating unit generates the second pulsed base current responsive to a trigger signal causing a base voltage of the BJT to drop while the feedback amplifier circuit operates to increase the emitter voltage of the BJT so as to build-up the base-emitter voltage to a predetermined voltage level when a light source turns on.

30 Claims, 7 Drawing Sheets

BIPOLAR JUNCTION TRANSISTOR PIXEL CIRCUIT, DRIVING METHOD THEREOF, AND IMAGE SENSOR

BACKGROUND

1. Technical Field

The present disclosure relates to a pixel circuit, a driving method thereof, and an image sensor, in particular, to a bipolar junction transistor (BJT) pixel circuit, a driving method thereof, and an image sensor.

2. Description of Related Art

An optical mouse, typically includes a light source to illuminate a navigation surface and an image sensor that functions as a miniature digital camera to continually capture images of the illuminated navigation surface and to determine the speed and direction that the optical mouse is being moved across the surface by comparing sequentially captured frames of image information so as to control the movement of a cursor displayed on a monitor. Optical mouse is generally equipped with a battery (e.g., dry cell battery) for supplying the necessary operating power.

Bipolar junction transistor (BJT) pixel circuit is one of the pixel circuits used in an image sensor of the optical mouse for capturing image data of the illuminated navigation surface. Please refer to FIG. 1 in conjunction with FIG. 2. FIG. 1 shows a schematic diagram illustrating a conventional BJT pixel circuit. FIG. 2 shows a timing waveform diagram illustrating the operation of the conventional BJT pixel circuit.

The BJT pixel circuit 9 includes a feedback amplifier circuit 91, a BJT transistor 93, a photodiode 95, a shutter circuit 97, and a storage capacitor 99. The feedback amplifier circuit 91, the photodiode 95, and the shutter circuit 97 are coupled to the BJT transistor 93, respectively. The storage capacitor 99 is coupled to the shutter circuit 97 and a ground GND, wherein the storage capacitor 99 is used for storing an image data captured by the photodiode 95.

The operation of the BJT pixel circuit 9 can be briefly described as follow. At start of each frame (e.g., time point TA), a light source (not shown) is pulsed on with a light control signal LS to generate a reflect light shone on the photodiode 95. The photodiode 95 operatively generates a base current IB responsive to the light intensity of a light illuminated from a light source. From time point TA and time point TB, the feedback amplifier circuit 91 begins to build up voltage across the emitter and the base of the BJT transistor 93 to increase the beta of the BJT transistor 93 to a stable level e.g., ~30, wherein the beta herein is the ratio between the collector current IC and the base current IB of the BJT transistor 93. Next, at time point TB, the BJT transistor 93 operates with a stable beta and generates a stable emitter current IE. The shutter circuit 97 is triggered on at the same time by a shutter signal such that the storage capacitor 99 can be discharged with a stable emitter current IE to capture the image data. Accordingly, when the shutter circuit 97 is triggered on, the voltage VSC across the storage capacitor 99 decreases as the storage capacitor 99 discharges through BJT transistor 93 with the emitter current IE.

Referring to FIG. 2 again, the time required from the light source turning on (e.g., time point TA) to the time the BJT transistor 93 obtaining a stable beta (e.g., time point TB) is defined as the pre-flash time of the BJT pixel circuit 9. The time required from the shutter circuit being triggered on (e.g., time point TB) until the completion of image capturing is defined as the exposure time. Particularly, for the BJT pixel circuit 9 provided in FIG. 1, the pre-flash time required is around 220 us while the time required for the shutter circuit 97 to be triggered on is around 10 s. Hence, the total duration that the light source needed to be turned on is approximately 230 us.

It is commonly known that any image captured with insufficient pre-flash time will appear to be darker due to low beta level. However, the amount of duration of the pre-flash time of the BJT transistor 93 and the on-time duration of light source has directly impact on the power consumption of the image sensor. That is, the longer the pre-flash time required by the BJT transistor 93, the longer the light source needed to be turned on, and more power is consumed by the optical mouse thereby reduce the battery life.

SUMMARY

According, an exemplary embodiment of the present disclosure provides a bipolar junction transistor (BJT) pixel circuit, a driving method thereof, and an image sensor, which can through boost the base-emitter voltage of the BJT to a predetermined threshold at start of each frame shortening the pre-flash time required by the BJT transistor thereby effectively lowering the power consumption of the BJT pixel circuit.

An exemplary embodiment of the present disclosure provides a BJT pixel circuit, which includes a BJT transistor, photodetector, a feedback amplifier circuit, a shutter circuit, and a current generating circuit. The BJT transistor has a collector thereof coupled to a ground. The photodetector has a first-end thereof coupled to a base of the BJT transistor and a second-end thereof coupled to the ground. The photodetector generates a first base current based on a light intensity of a light incident on the photodetector, wherein the light is illuminated from a light source. The feedback amplifier circuit is coupled to the base of the BJT transistor and an emitter of the BJT transistor. The feedback amplifier circuit operative to increase an emitter voltage of the BJT transistor according to the light intensity. The shutter circuit is coupled to the feedback amplifier circuit. The shutter circuit operative to control an exposure time of the photodetector according to a shutter signal. The current generating unit is coupled to the base of the BJT transistor. The current generating unit is configured to generate a second pulsed base current to the base of the BJT transistor upon receiving a falling edge of trigger signal.

The current generating unit generates the second pulsed base current responsive to the trigger signal causing a base voltage of the BJT transistor to drop while the feedback amplifier circuit operates to increase the emitter voltage of the BJT transistor so as to build up the base-emitter voltage to a predetermined voltage level when the light source turns on.

According to one exemplary embodiment of the present disclosure, the trigger signal has a predetermined pulse duration which is determined by a pre-flash time of the BJT transistor and the exposure time of the photodetector, wherein the exposure time begins after the pre-flash time. The pre-flash time is the time required from the light source being turned on to the time that the BJT transistor operates with a stable beta.

According to one exemplary embodiment of the present disclosure, during the exposure time, the shutter circuit is triggered to allow the storage capacitor to discharge through the emitter and the collector of the BJT transistor.

An exemplary embodiment of the present disclosure provides an image sensor which is adapted for an optical navigation device. The image sensor includes a light source, a pixel array, and a processor. The light source operative to illuminate a working surface of the optical navigation device according to a first control signal.

The pixel array includes a plurality of the BJT pixel circuits. The processor is respectively coupled to the BJT pixel circuits and the light source. The BJT pixel circuits are configured for capturing an image corresponding to the working surface. Each BJT pixel circuit includes a BJT transistor, photodetector, a feedback amplifier circuit, a shutter circuit, and a current generating circuit. The BJT transistor has a collector thereof coupled to a ground. The photodetector has a first-end thereof coupled to a base of the BJT transistor and a second-end thereof coupled to the ground. The photodetector generates a first base current based on a light intensity of a light incident on the photodetector, wherein the light is illuminated from a light source. The feedback amplifier circuit is coupled to the base of the BJT transistor and an emitter of the BJT transistor. The feedback amplifier circuit is operative to increase an emitter voltage of the BJT transistor according to the light intensity. The shutter circuit is coupled to the feedback amplifier circuit. The shutter circuit is operative to control an exposure time of the photodetector according to a shutter signal. The current generating unit is coupled to the base of the BJT transistor. The current generating unit is configured to generate a second pulsed base current to the base of the BJT transistor upon receiving a falling edge of trigger signal. The processor generates the first control signal, the trigger signal, and the shutter signal, to control the operations of the light source, the current generating unit, and the shutter circuit, respectively according to a predetermined frame rate.

An exemplary embodiment of the present disclosure provides a driving method of the aforementioned BJT pixel circuit. The driving method comprising: turning on a light source to shine a light on the photodetector so as to generate a first base current to build a base voltage of the BJT transistor; causing the current generating unit to generate a second pulsed base current upon receiving a falling edge of a trigger signal to lower the base voltage of the BJT transistor; driving the feedback amplifier circuit to increase an emitter voltage of the BJT transistor according to a light intensity of the light incident so as to increase a base-emitter voltage of the BJT transistor to a predetermined voltage level as the light source being turned on.

According to one exemplary embodiment of the present disclosure, after the step of increasing the base-emitter voltage of the BJT transistor to the predetermined voltage level comprises: providing a shutter signal triggering the shutter circuit to begin an exposure time after the pre-flash time expired; capturing an image data during the exposure time; switching the voltage level of the trigger signal to cause the current generating unit to generate another second pulsed base current and turning off the light source.

According to one exemplary embodiment of the present disclosure, before providing a shutter signal comprises: detecting the light intensity of the light incident on the photodetector; determining the exposure time based on the light intensity of the light detected by the photodetector.

To sum up, an exemplary embodiment of the present disclosure provides a BJT pixel circuit, a driving method thereof, and an image sensor, which can be adapted in an optical navigation device. The BJT pixel circuit can effectively shorten the pre-flash time of the BJT transistor by quickly build up the base-emitter voltage of the BJT transistor to a predetermined voltage level with additional pulsed base current when the light source turns on at start of each frame. Accordingly, the power consumption of the BJT pixel circuit during each frame can be effectively reduced thereby enhances the battery life of the optical navigation device.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Wherever possible, the same reference numbers are used in the drawings and the description to refer to the same or like parts.

(An Exemplary Embodiment of a BJT Pixel Circuit)

Figure 3:
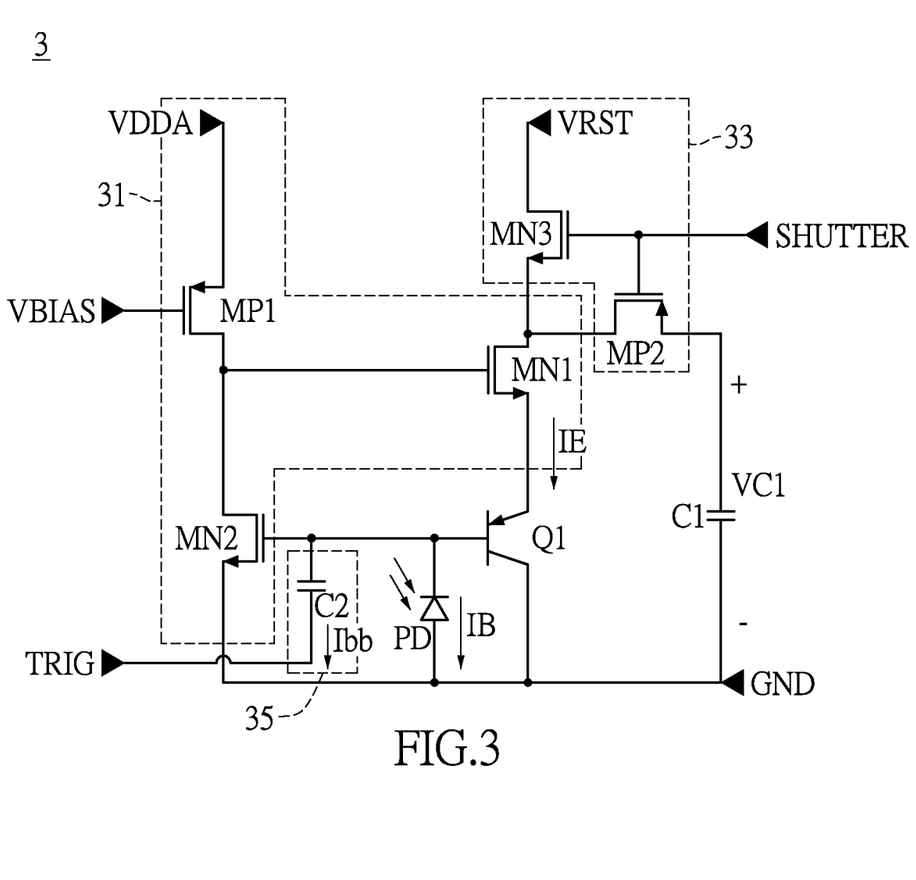
FIG. 3 is a schematic diagram illustrating a bipolar junction transistor (BJT) pixel circuit provided in accordance to an exemplary embodiment of the present disclosure.

Please refer to FIG. 3, which shows a schematic diagram illustrating a bipolar junction transistor (BJT) pixel circuit provided in accordance with an exemplary embodiment of the present disclosure. The BJT pixel circuit 3 is used in a pixel array of an image sensor of an optical navigation device (not shown) for capturing an image data. In the instant embodiment, the optical navigation device may include but not limited to an optical mouse, a track pad, or a joystick. The optical navigation device is equipped with a battery for providing the necessary operational power, wherein the battery may be a dry cell battery. In other implementation, the optical navigation device may acquire operation power from a host computing device (e.g., a personnel computer or a laptop) through cable connection such as USB connection.

The BJT pixel circuit 3 of the instant disclosure can quickly increase the voltage across the base and the emitter of the BJT to a predetermined voltage level through providing additional pulsed base current when the a light source (not shown) turns on thereby effectively shorten the pre-flash time required and reduce the power consumption so as to enhance the battery life of the optical navigation device.

The BJT pixel circuit 3 includes a BJT transistor Q1, a photodetector, a feedback amplifier circuit 31, a shutter circuit 33, a current generating circuit 35, and a storage capacitor C1. The BJT transistor Q1 in the instant embodiment is a PNP bipolar junction transistor. The photodetector may be implemented by a photodiode PD, however in practice, the photodetector may be any light sensing elements or circuits that transform light intensity into a voltage value and the present disclosure is not limited thereto.

To put it concretely, the photodetector is coupled between a base of the BJT transistor Q1 and a ground terminal GND. The feedback amplifier circuit 31 is coupled to the base of the BJT and an emitter of the BJT. The feedback amplifier circuit 31 is also coupled to a power terminal VDDA to receive an operation voltage. The feedback amplifier circuit 31 is further coupled to a bias terminal VBIAS to receive a bias voltage. The shutter circuit 33 is coupled to a control terminal VRST to receive a supply voltage therefrom. The shutter circuit 33 also is coupled to the feedback amplifier circuit 31 and a storage capacitor C1. The shutter circuit 33 is further coupled to a shutter terminal SHUTTER to receive a shutter signal therefrom. The current generating unit 35 is coupled between the base of the BJT transistor Q1 and a trigger terminal TRIG The bias terminal VBIAS, the trigger terminal TRIG, the control terminal VRST, and the shutter terminal SHUTTER are coupled to a processor (not shown), respectively.

At the start of each frame, the processor turns on the light source to illuminate a working surface of the optical navigation device. Meanwhile, the photodetector operatively generates a first base current IB based on a light intensity of a light incident on the photodetector, wherein the light is the reflected light from the working surface illuminated by the light source.

The current generating unit 35 at the same time operatively generates the second pulsed base current Ibb responsive to a trigger signal inputted from the trigger terminal TRIG causing a base voltage VB of the BJT transistor Q1 to drop. Meanwhile, the feedback amplifier circuit 31 operates to increase the emitter voltage VE of the BJT transistor Q1 responsive to the light intensity of the light so as to build up the voltage across the base and the emitter (e.g., the base-emitter voltage VBE) of the BJT transistor Q1 to a predetermined voltage level when the light source turns on.

The feedback amplifier 31 continues to operatively increase the base-emitter voltage VBE of the BJT transistor Q1 so as to increase the beta of the BJT transistor Q1 to a stable level after the base-emitter voltage VBE has reached the predetermined voltage level. In which, the beta of a stable level herein represents a state where the BJT transistor Q1 operates with a stable base-emitter voltage VBE and generates a stable emitter current IE. Next, the shutter circuit 33 is triggered on to start an exposure time of the photodetector according to the shutter signal immediately after the BJT transistor Q1 operates stable beta. Such that the storage capacitor C1 can be stably discharged through the emitter and the collector of the BJT transistor Q1 with the emitter current IE. Accordingly, the image data corresponds to an area of the working surface being covered by the BJT pixel circuit 3 can be properly captured.

In short, the BJT transistor Q1 of the BJT pixel circuit 3 can quickly obtain a stable beta (e.g., beta of 30) after the light source is turned on so as to shorten the pre-flash time of the BJT transistor Q1 thereby reduce the power consumption of the BJT pixel circuit 3.

In the instant embodiment, the photodetector includes a photodiode PD. The feedback amplifier circuit 31 includes a PMOS transistor MP1, a NMOS transistor MN1, and a NMOS transistor MN2. The shutter circuit 33 includes a NMOS transistor MN3 and a PMOS transistor MP2. The current generating unit 35 includes a coupling capacitor C2.

Specifically, a collector of the BJT transistor Q1 is coupled to a ground through the ground terminal GND. The photodiode PD has a cathode thereof coupled to the base of the BJT transistor Q1 and an anode thereof coupled to the ground through the ground terminal GND. The cathode of the photodiode PD is further coupled to the collector of the BJT transistor Q1. In other words, the photodiode PD is coupled between the base of the BJT transistor Q1 and the ground terminal GND.

The coupling capacitor C2 is coupled between the base of the BJT transistor Q1 and the trigger terminal TRIG A first-end of the coupling capacitor C2 is coupled to the base of the BJT transistor Q1 and a second-end of coupling capacitor C2 is coupled to the trigger terminal TRIG. Such that the coupling capacitor C2 can operatively generate the second pulsed base current Ibb at the first-end thereof to the base of the BJT transistor Q1 upon receiving a falling edge of the trigger signal at the second-end.

A source of the PMOS transistor MP1 of the feedback amplifier circuit 31 is further coupled to the power terminal VDDA to receive the operating voltage therefrom. A drain of the PMOS transistor MP1 is coupled to a gate of the NMOS transistor MN1. The drain of the PMOS transistor MP1 is also coupled to a drain of the NMOS transistor MN2. A gate of the PMOS transistor MP1 is coupled to a bias terminal VBIAS to receive the bias voltage. A gate of the NMOS transistor MN2 is coupled to the base of the BJT transistor Q1. The gate of the NMOS transistor MN2 is also coupled to the first-end of the coupling capacitor C2 and the cathode of the photodiode PD.

Moreover, a source of the NMOS transistor MN1 is coupled to the emitter of the BJT transistor Q1. A drain of the NMOS transistor MN1 is coupled to a source of the NMOS transistor MN3 of the shutter circuit 33. The drain of the NMOS transistor MN1 is also coupled to a drain of the PMOS transistor MP2 of the shutter circuit 33. A drain of the NMOS transistor MN3 is coupled to the control terminal VRST to correspondingly receive the supply voltage therefrom during the pre-flash time. A gate of the NMOS transistor MN3 is coupled to a gate of the PMOS transistor MP2. A source of the PMOS transistor MP2 is coupled to a first-end of the storage capacitor C1. The second-end of the storage capacitor C1 is coupled to the ground terminal GND. The gate of the NMOS transistor MN3 and the gate of the PMOS transistor MP1 are further coupled to a shutter terminal SHUTTER to receive the shutter signal and selectively form a discharge path for the storage capacitor C1 to discharge with the emitter current IE thereby control the exposure time of the photodiode PD.

Additionally, the processor is respectively coupled to the bias terminal VBIAS, the trigger terminal TRIG, and the shutter terminal SHUTTER to control the operation of the BJT pixel circuit 3 according to a predetermined frame rate.

Figure 4:
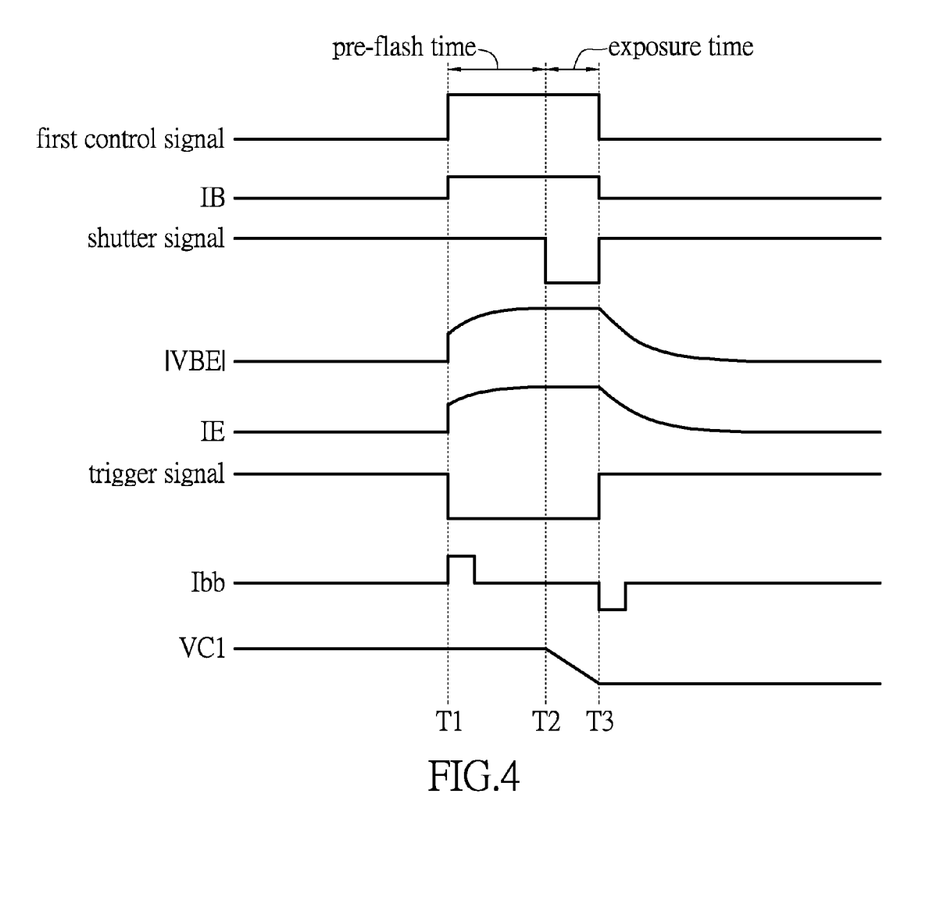
FIG. 4 is a timing waveform diagram illustrating the operation of the BJT pixel circuit.

The following descriptions describe the operation of the BJT pixel circuit 3 in detail. Please refer to FIG. 4 in conjunction with FIG. 3, wherein FIG. 4 shows a timing waveform diagram illustrating the operation of the BJT pixel circuit.

When the optical navigation device operates in a run mode, the power terminal VDDA is supplied with the operating voltage while the voltage bias terminal VBIAS is supplied with a constant bias voltage to the gate of the PMOS transistor MP1 to adjust the impedance of PMOS transistor MP1 to a constant value. The control terminal VRST is supplied with a constant supply voltage for controlling the of the shutter circuit 33. It shall be noted that the operating voltage, the bias voltage, and the supply voltage may be configured according to the operational requirement of the BJT pixel circuit 3.

At start of a frame (i.e. at time point T1), the processor outputs a first control signal of positive voltage level (e.g., active high pulse signal) turning on the light source so as to illuminate the working surface of the optical navigation device. The photodiode PD operatively generates the first base current IB to increase the base voltage VB of the BJT transistor Q1 based on the light intensity of the light incident on the photodiode PD, wherein the light is a reflected light from the illuminated working surface. At the same time, the processor outputs the trigger signal of negative voltage level (e.g., active low pulse signal) to the second-end of the coupling capacitor C2 through the trigger terminal TRIG to generate electrons forming the second pulsed base current Ibb causing the base voltage VB to drop slightly. More specifically, the coupling capacitor C2 generates the second pulsed base current Ibb in form of a positive pulse upon receiving the falling edge of the trigger signal so as to lower the base voltage VB.

As the base voltage VB of the BJT transistor Q1 decreases, the gate voltage VGN2 of the NMOS transistor MN2 decreases causing the impedance of the NMOS transistor MN2 to increase. Increasing in the impedance of the NMOS transistor MN2 increases the gate voltage VGN1 of the NMOS transistor MN1 as less voltage are drop across the source-drain of the PMOS transistor MP1. When the gate voltage VGN1 of the NMOS transistor MN1 increases, the emitter voltage VE of the BJT transistor Q1 increases thereby build-up the voltage across the base and the emitter (e.g., the base-emitter voltage VBE) of the BJT transistor Q1 to the predetermined voltage level.

The predetermined voltage level may be for instance one-fourth, half, or three-fourth of the base-emitter voltage VBE of which the BJT transistor Q1 can operate with a stable beta (e.g., 30). It shall be noted that in practice, the predetermined voltage level may vary with the actual type or the actual implementation of the BJT transistor Q1.

After time point T1, the voltage across the base and the emitter (i.e., the base-emitter voltage) of the BJT transistor Q1 continues to increase until the BJT transistor Q1 operates with a stable level which occurs at time point T2. The time interval between time point T1 and time point T2 is defined as the pre-flash time of the BJT pixel circuit 3. Particularly, as previously described, the pre-flash time herein represents the time required from the light source being turned on to the time that the BJT transistor Q1 operates with a stable beta. Moreover, the pre-flash time may be predetermined and stored in the processor. For instance, the pre-flash time may be acquired by determining a beta required from the I-V characteristic in the datasheet of the BJT transistor Q1 and conducting operational testing with the BJT transistor Q1 to verify the time required to obtain the beta desired.

At time point T2, the processor outputs the shutter signal of negative voltage level (e.g., an active low pulse signal) turning on the PMOS transistor MP2 while turning off the NMOS transistor MN3 so as to initiate the exposure time. During the exposure time (i.e. from time point T2 to time point T3), the storage capacitor C1 stably discharges through the BJT transistor Q1 with the emitter current IE to capture the image data. Specially, the voltage VC1 of the storage capacitor C1 starts decreasing as the storage capacitor C1 discharges through the PMOS transistor MP2, NMOS transistor MN1, and the BJT transistor Q1.

At time point T3, the processor simultaneously turns off the light source, the shutter circuit 33, and the current generating circuit 35. For instance, the processor may output the first control signal with low voltage level to turn off the light source, and the shutter signal with positive voltage level turning off the PMOS transistor MP2 while turning on the NMOS transistor MN3. At the same time, the processor can switch back or flip the trigger signal i.e., switches the voltage level of the trigger signal from negative voltage level to positive voltage level and causes the coupling capacitor C2 to generate another second pulsed base current in form of a negative pulse to the base of the BJT transistor Q1. After time point T3, the base-emitter voltage VBE of the BJT transistor Q1 begins to decrease until the emitter current IE drops down to zero.

Figure 5:
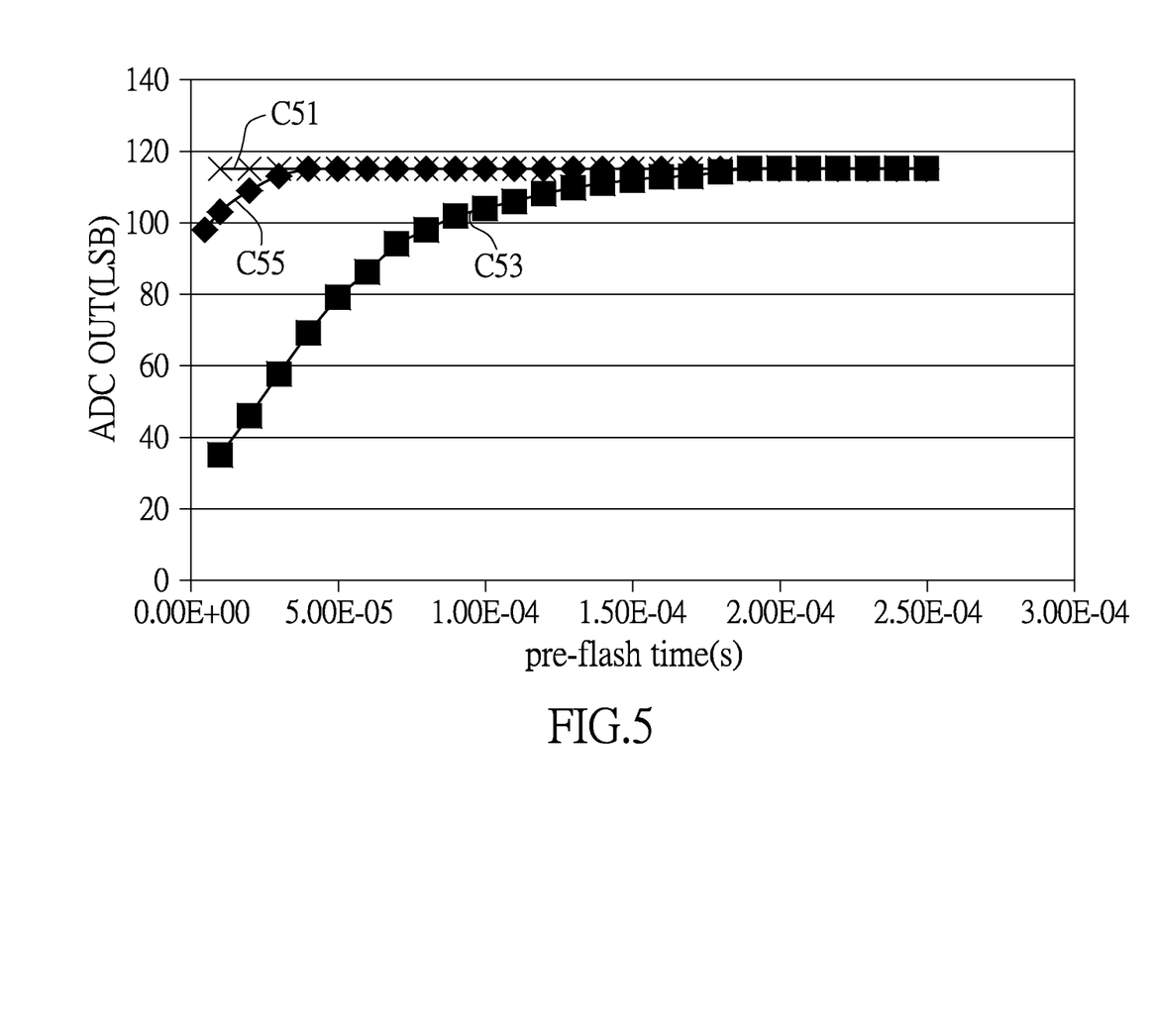
FIG. 5 is a diagram of pre-flash time comparison provided in accordance with an exemplary embodiment of the present disclosure.

Next, please refer to FIG. 5 in conjunction with FIG. 4. FIG. 5 shows a diagram of pre-flash time comparison provided in accordance with an exemplary embodiment of the present disclosure. Particularly, FIG. 5 shows the comparison among the conventional BJT pixel circuit with the light source being constantly turned on, the conventional BJT pixel circuit 9 of FIG. 1, and the BJT pixel circuit 3 for a specific circuit implementation.

Curve C51 represents the relationship between the adc output value and the pre-flash time for the conventional BJT pixel circuit with the light source being constantly turned on. Curve C53 represents the relationship between the adc output value and the pre-flash time for the conventional BJT pixel circuit of FIG. 1. Curve C55 represents the relationship between the adc output value and the pre-flash time for the BJT pixel circuit 3.

It can be noted from FIG. 5, even though the adc output value is always stable (i.e., no pre-flash time required) for the conventional BJT pixel circuit with the light source being constantly turned on since the base-emitter voltage of the BJT transistor is stable. However, unnecessary power will be drawn and consumed as the result of having the light source constantly turned on. The BJT pixel circuit 3 has pre-flash time around 30 us as depicted by curve C55 while the conventional BJT pixel circuit 9 of FIG. 1 has a pre-flash time around 220 us as depicted by curve C53. Accordingly, the BJT pixel circuit 3 effectively shorten the pre-flash time required reducing the amount of light source current consumed in the circuit thereby reduce the overall power consumption.

Figure 1:
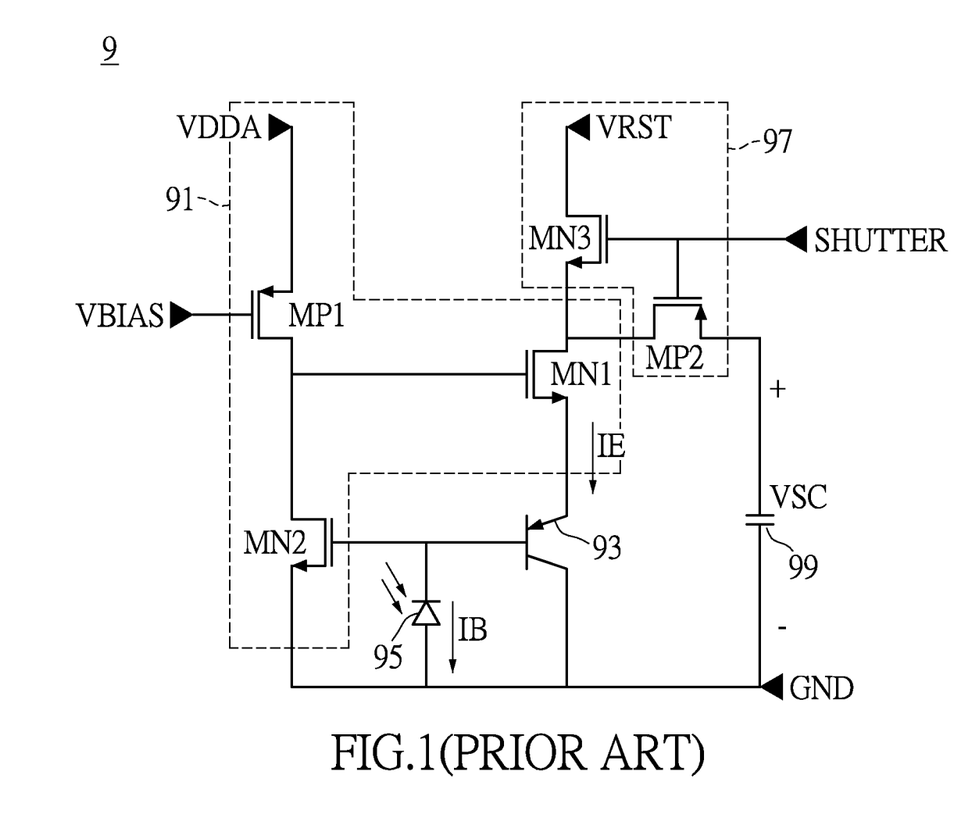
FIG. 1 is a schematic diagram illustrating a conventional BJT pixel circuit.
Figure 2:
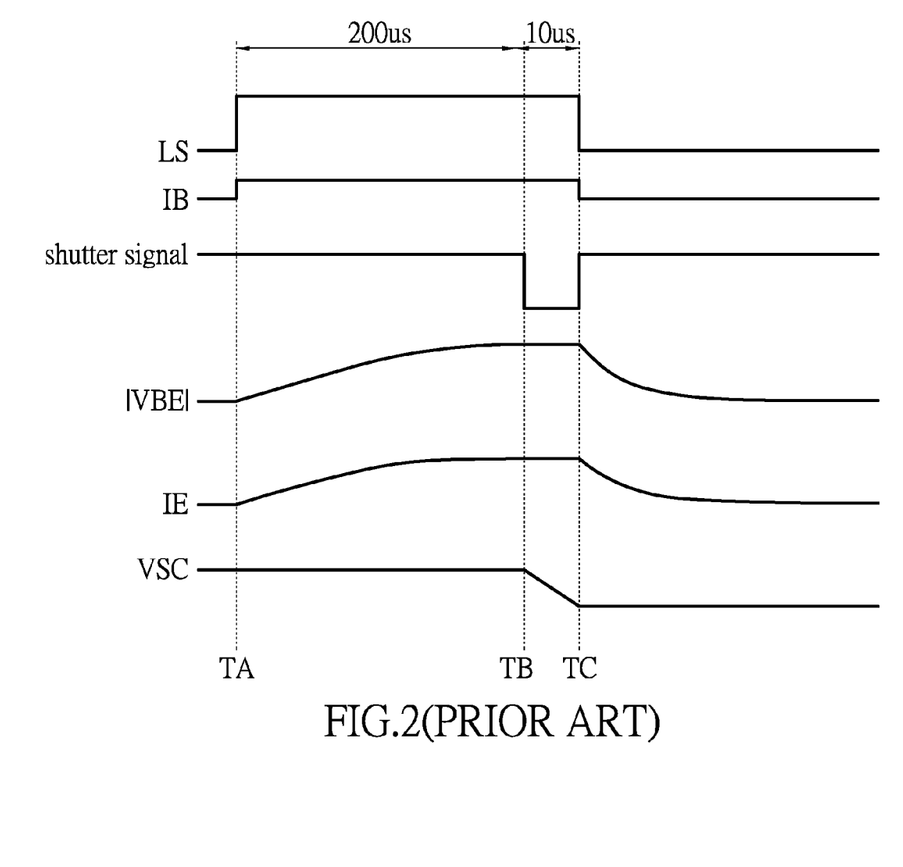
FIG. 2 is a timing waveform diagram illustrating the operation of the conventional BJT pixel circuit.

In comparison to the conventional BJT pixel circuit of FIG. 1, the base-emitter voltage VBE of the BJT transistor Q1 in the BJT pixel circuit 3 is instantly increased to a high voltage level (e.g., 83%) at the start of each frame in comparison to a low voltage level (e.g., 28%) of the conventional BJT circuit thereby the BJT pixel circuit 3 disclosed can effectively shorten the pre-flash time required for the BJT transistor Q1 e.g., the pre-flash time is cut down by 86.3%. It shall be noted that FIG. 5 is merely used as an illustration for describing a circuit operation of the BJT pixel circuit, and the present disclosure is not limited thereof.

It is worth to mention that the light source of the instant embodiment may be a light-emitting diode (LED) or a laser diode (LD). The processor may for example be the processing chips such as a central processing unit, a microcontroller, or an embedded controller placed in optical navigation device, however the instant embodiment is not limited thereto.

The capacitance of the storage capacitor C1 may be configured according to the size of the BJT pixel circuit 3. For instance, for a BJT pixel circuit with size of 50 um, the capacitance of the storage capacitor C1 is configured to be 280 femto Farad (fF). The capacitance of the coupling capacitor C2 may be on the order of 10 fF, however the actual capacitance of the coupling capacitor C2 may be configured according to the operational requirement of the BJT pixel circuit 3 and the instant embodiment is not limited thereto.

Please refer to FIG. 4 again, the turn-on duration (e.g., the pulse duration of the first control signal) of the light source is determined by the pre-flash time of the BJT transistor Q1 and the exposure time. The pulse duration of the first control signal is equal to the sum of the pre-flash time and the exposure time i.e., from time point T1 to time point T3, wherein the exposure time begins right after the pre-flash time. For instance, in the instant embodiment, the pre-flash time required for the BJT pixel circuit 3 is around 30 us while the exposure time is preset to be 10 us, hence the pulse duration of the first control signal is 40 us.

Moreover, the trigger signal has a predetermined duration which is the same duration as the turn-on duration of the light source. That is, the falling edge of the trigger signal is synchronized with the rising edge of the first control signal of the light source as illustrated at time point T1. Alternatively, the pulse duration of the trigger signal is synchronized with the pre-flash time of the BJT pixel circuit. Henceforth, in the instant embodiment, the predetermined pulse duration of the trigger signal is also determined by the pre-flash time of the BJT transistor Q1 and the exposure time of the photodiode PD.

(An Exemplary Embodiment of an Image Sensor)

Figure 6:
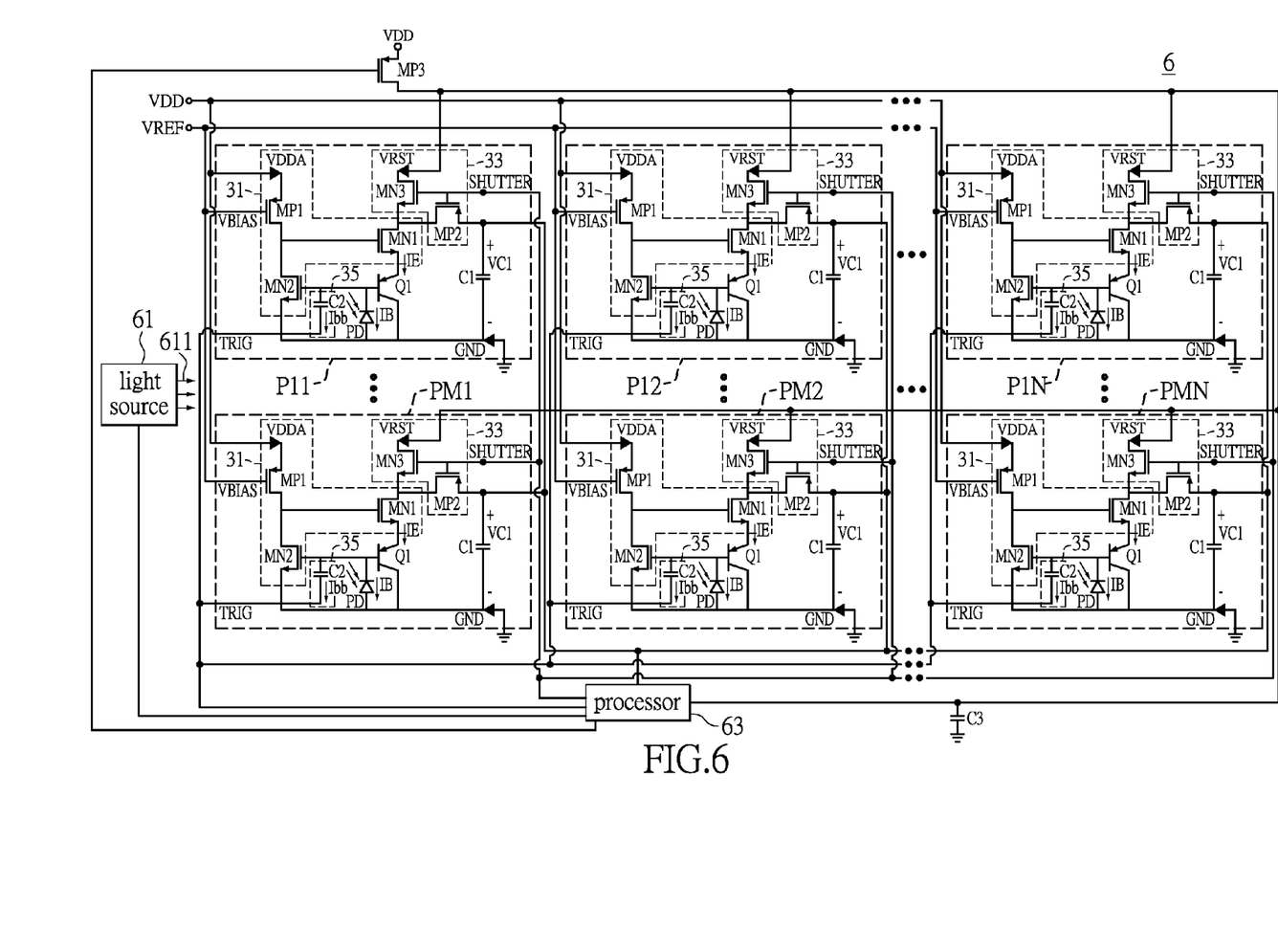
FIG. 6 is a schematic diagram illustrating an image sensor provided in accordance to an exemplary embodiment of the present disclosure.

Please refer to FIG. 6, which shows a schematic diagram illustrating an image sensor provided in accordance to an exemplary embodiment of the present disclosure. The image sensor 6 is adapted in an optical navigation device such as an optical mouse, a track pad or a joystick. The image sensor 6 includes a light source 61, a pixel array, a processor 63, and a storage capacitor C3, wherein the pixel array comprises of a plurality of BJT pixel circuits P11~PMN. The processor 63 is coupled to the plurality of BJT pixel circuits P11~PMN, the storage capacitor C3, and the light source, respectively. In the instant embodiment, a PMOS transistor MP3 is configured as an active load for providing a controllable and constant supply voltage to each of the shutter circuit 33s through the respect control terminal VRST.

Specifically, a gate of a PMOS transistor MP3 is also coupled to the processor 63. A source of the PMOS transistor MP3 is coupled to the power terminal VDDA to receive the operating voltage VDD. A drain of the PMOS transistor MP3 is respectively coupled to the drain of NMOS transistor MN3 of each BJT pixel circuit P11~PMN so as to provide a supply voltage to the drain of NMOS transistor MN3 of each BJT pixel circuit P11~PMN.

The processor 63 controls the operations of the light source 61 and the plurality of BJT pixel circuits P11~PMN according to a predetermined frame rate of the image sensor 6. The predetermined frame rate may be configured according to the operational requirement of the image sensor 6 and predefined in the processor 63 via firmware design. Moreover, the resolution of the image sensor 6 of the instant embodiment is M×N.

When the optical navigation device operates in run mode, a power terminal VDDA of each BJT pixel circuit (e.g., BJT pixel circuit P11~MN) is supplied with an operating voltage VDD while a voltage bias terminal VBIAS of each BJT pixel circuit (e.g., BJT pixel circuits P11~MN) is supplied with a constant bias voltage VREF to configure the impedance of PMOS transistor MP1 in each BJT pixel circuit. The processor 63 can configure the supplying voltage by varying the gate voltage of the PMOS transistor MP3 and adjusting the impedance of the PMOS transistor MP3. It shall be noted that the operating voltage VDD, the bias voltage VREF, and the supply voltage can be configured according to the operational requirements of the image sensor 6.

At the start of each frame, the processor 63 turns on the light source 61 with a first control signal to illuminate a working surface of the optical navigation device. The photodiodes PD immediately generates and outputs a first base current IB into the base of the respect BJT transistor Q1 responsive to the light 611 incident thereon. The processor 63 at same time outputs the trigger signal to the coupling capacitors C2 of the BJT pixel circuits P11~PMN to generate electrons injected into the base of the respect BJT transistor Q1 forming the second pulsed base current Ibb so as to lower the base voltage VB of the respect BJT transistor Q1. Meanwhile, the feedback amplifier circuit 31 operates to increase the emitter voltage VE of each respect BJT transistor Q1 building up the base-emitter voltage VBE to a predetermined voltage level as the light source 61 turns on. The base-emitter voltage VBE continually to increase until the respect BJT transistor Q1 operates with a stable beta, thereby completes the pre-flash time. Subsequently, the processor 63 configures the supply voltage and triggers the shutter circuit 31 of each BJT pixel circuit P11~PMN to begin the exposure time so as to have the storage capacitor C1 of each BJT pixel circuit P11~PMN discharged with the respect emitter current IE. The processor 63 then turns off the light source 61 and the shutter circuit 33 while switch the trigger signal from negative voltage level to positive voltage level i.e., outputs the trigger signal of positive voltage level. At the same time, the coupling capacitor C2 generates another second pulsed base current in form of a negative pulse to base of the BJT transistor Q1. The image sensor 6 with the BJT pixel circuits P11~PMN thus can effectively reduce the power consumption of the image sensor 6 by shorten the pre-flash time of the BJT transistor Q2.

The operation of the BJT pixel circuit P11~PMN is essentially the same as the BJT pixel circuit described in FIG. 3. Based on the aforementioned circuit structure and operation details, those skilled in the art should be all to deduce the operation of the image sensor 6 and further description are hereby omitted.

Additionally, the processor 63 may configure the pre-flash time and the exposure time of each BJT pixel circuit based on the actual type of BJT transistor and the operational requirement of image sensor 6.

Specifically, the processor 63 may determine the duration of the shutter signal (or equivalently the exposure time) based on the brightness or contrast of the working surface travelled by the optical navigation device. Since it is known that the darker the working surface is, the longer the duration of the shutter signal is needed, and the brighter the working surface is, the shorter the duration of the shutter signal is needed.

In one implementation, the processor 63 may actively configure the pulse duration of the shutter signal during the pre-flash time. More specifically, the processor 63 may adjust the pulse duration according to an average adc output value detected for each of the BJT pixel circuit P11~PMN, wherein the average adc output value is a computed digitized value representing average charges stored in the storage capacitors C1 of the BJT pixel circuits P11~PMN. An analog to digital (A/D) converter circuit (not shown) may be inserted between the storage capacitor C1 and the processor 63 to digitize the output of the storage capacitor C1 of each BJT pixel circuit P11~PMN.

For instance, the processor 63 may determine whether the average adc output value detected is greater than a minimum adc threshold pre-stored in the processor 63 during the pre-flash time. When the processor 63 determines that the average adc output value detected is less than the minimum adc threshold indicating that the present working surface is too dark, the processor 63 can increases the exposure time for the BJT pixel circuits P11~PMN step by step over several frames until the average adc output value detected become greater than the adc minimum threshold.

When the average adc output value detected is greater than a maximum adc threshold indicating that the present working surface is too bright, the processor 63 may decrease the duration of the exposure time. The minimum adc threshold may correspond to the minimum acceptable brightness level of the working surface while maximum adc threshold may correspond to the maximum acceptable brightness level of the working surface.

Similarly, the processor 63 further can use the average adc output value computed to verify whether the pre-flash time for the BJT pixel circuits P11~PMN is sufficient enough.

In another implementation, the processor 63 may detect the total shutter time needed on the working surface for all the BJT pixel circuits P11~PMN in the image sensor 6 to discharge the storage capacitor C3 to a threshold voltage. Next, the processor 63 computes and records the exposure time based on the amount of time required to discharge the storage capacitor C3 to a threshold voltage, the processor 63 outputs the shutter signal to trigger the shutter circuit 33 of each BJT pixel circuit for the exposure time determined so as to capture the image data of the illuminated working surface.

In the instant embodiment, the threshold voltage may be defined based on multiple of the time constant of the storage capacitor C3 or the ratio between the capacitance of the storage capacitor C1 and total number of the BJT pixel circuits P11~PMN in the image sensor 6.

Accordingly, the overall frame duration required for this exposure time detection method is equal to the sum of the pre-flash time, the exposure duration detection time, and the exposure time, wherein the exposure time is the same as the exposure duration detection time. For instance, supposing the pre-flash time is 30 us, the exposure duration detection time is 10 us, and the exposure time is 10 us, then the overall frame duration required is equal to 50 us.

Henceforth, the image sensor 6 having the BJT pixel circuit P11~PMN not only may reduce the overall power consumption for each frame by shorten the pre-flash time of the BJT transistors Q1. Moreover, by stabilizing the operation of the BJT transistors Q1 also improves the tracking operation of the optical navigation device on a darker working surface. The image sensor 6 with the BJT pixel circuits P11~PMN further can actively configure the exposure time based on the working surface where the optic navigation device travelled, enhanced the applicability of the BJT pixel circuit.

(An Exemplary Embodiment of a Driving Method of a BJT Pixel Circuit)

Figure 7:
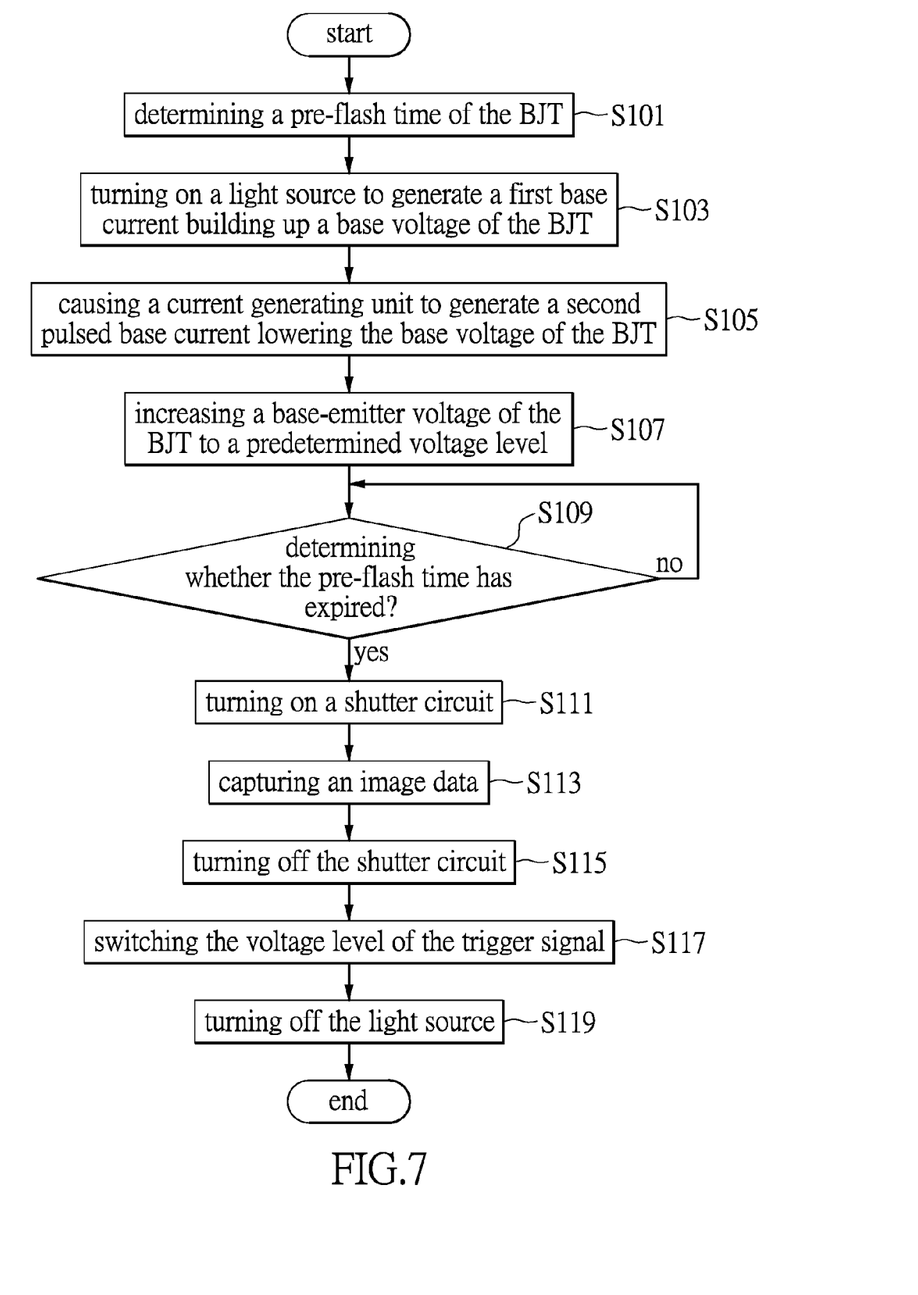
FIG. 7 is a flowchart diagram illustrating a driving method for a BJT pixel circuit in accordance to an exemplary embodiment of the present disclosure.

From the aforementioned exemplary embodiments, the present disclosure may generalize a driving method for a BJT pixel circuit in an image sensor illustrated in the aforementioned embodiment. Please refer to FIG. 7 in conjunction to FIG. 1, wherein FIG. 7 shows a flowchart diagram illustrating a driving method for a BJT pixel circuit in accordance to an exemplary embodiment of the present disclosure. The BJT pixel circuit is coupled to a processor (not shown), wherein the driving method may be implement through firmware design.

In Step S101, the processor determines a pre-flash time of the BJT transistor Q1. The pre-flash time may be predefined and stored in the processor through firmware design. In Step S103, at start of each frame, the processor outputs a first control signal of positive voltage level to turn on a light source (not shown) shining a light on the photodetector (i.e., a photodiode PD). The photodetector operatively generate a first base current based on the light intensity of the light incident thereon so as to increase a base voltage VB of the BJT transistor Q1. In Step S105, the processor drives a current generating unit 35 (i.e., the coupling capacitor C2) with a trigger signal of negative voltage level to generate a second pulsed base current Ibb lowering the base voltage VB of the BJT transistor Q1. Specifically, the current generating unit 35 generates the second pulsed based current Ibb in form of a positive pulse to the base of the BJT transistor Q1 upon receiving a falling edge of the trigger signal. In Step S107, the feedback amplifier circuit 31 operatively increases a base-emitter voltage VBE of the BJT transistor Q1 to a predetermined voltage level. In Step S109, the processor determines whether the pre-flash time has expired. When the processor determines that the pre-flash time has expired, executes Step S111; otherwise, executes Step 109.

In Step S111, the processor triggers on the shutter circuit 33 with a shutter signal to initiate an exposure time of the photodetector (i.e., the photodiode PD) after the pre-flash time. In which, the pulse duration of the shutter signal may be predefined in the processor. Or as previously described, the processor may actively configure the exposure time according to the brightness level of the working surface. For instance, the processor may determine the exposure time based on the light intensity of the light incident on the photodetector at each frame.

Next, in Step S113, the processor drives the BJT pixel circuit 3 capturing an image data corresponding to the working surface. Afterward, the processor turns off the shutter circuit. (Step S115) At same time the processor switches the voltage level of the trigger signal from negative voltage level to positive voltage level, and causes the current generating unit 35 to generate another second pulsed base current in form of a negative pulse to the base of the BJT transistor Q1. (Step S117). In Step S119, the processor turns off the light source.

In summary, exemplary embodiments of the present disclosure provides a BJT pixel circuit, a driving method thereof, and an image sensor, which can be adapted in an optical navigation device. The BJT pixel circuit can effectively shorten the pre-flash time of the BJT transistor by quickly building up the base-emitter voltage VBE of the BJT transistor to a predetermined voltage level with additional pulsed base current when the light source turns on at each start of frame.

Accordingly, the power consumption of the BJT pixel circuit during each frame can be effectively reduced. Moreover, by quickly stabilizing the operation of the BJT transistor at start of each frame, the tracking performance of the optical navigation device on a darker working surface can be greatly improved as well.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A bipolar junction transistor (BJT) pixel circuit, comprising:
a BJT transistor, a collector thereof coupled to a ground;
a photodetector, having a first-end thereof coupled to a base of the BJT transistor, a second-end thereof coupled to the ground, the photodetector generating a first base current based on a light intensity of a light incident on the photodetector, wherein the light is illuminated from a light source;

a feedback amplifier circuit, coupled to the base of the BJT transistor and an emitter of the BJT transistor, operative to increase an emitter voltage of the BJT transistor according to the light intensity;

a shutter circuit, coupled to the feedback amplifier circuit, operative to control an exposure time of the photodetector according to a shutter signal; and a current generating unit, coupled to the base of the BJT transistor, generating a second pulsed base current to the base of the BJT transistor upon receiving a trigger signal;

wherein the current generating unit generates the second pulsed base current responsive to the trigger signal causing a base voltage of the BJT transistor to drop while the feedback amplifier circuit operates to increase the emitter voltage of the BJT transistor so as to build up the base-emitter voltage to a predetermined voltage level when the light source turns on.

2. The BJT pixel circuit according to claim 1, wherein the current generating unit comprises:

a coupling capacitor, having a third-end thereof coupled to the base of the BJT transistor and a fourth-end thereof configured to receive the trigger signal.

3. The BJT pixel circuit according to claim 1, wherein the trigger signal is an active low pulse signal, wherein the duration of the trigger signal is synchronized with a turn-on duration of the light source.

4. The BJT pixel circuit according to claim 3, wherein the trigger signal has a predetermined pulse duration which is determined by a pre-flash time of the BJT transistor and the exposure time of the photodetector, and the exposure time begins after the pre-flash time, wherein the pre-flash time is the time required from the light source being turned on to the time that the BJT transistor operates with a stable beta.

5. The BJT pixel circuit according to claim 3, wherein during the pre-flash time, the photodetector supplies the first base current to the base of the BJT transistor based on the light intensity of the light incident thereon while the current generating unit supplies the second pulsed base current responsive to a falling edge of the trigger signal to the base of the BJT transistor causing the base voltage of the BJT transistor to drop.

6. The BJT pixel circuit according to claim 3, wherein the exposure time is determined according to the light intensity detected by the photodetector.

7. The BJT pixel circuit according to claim 1, further comprising:

a storage capacitor, having a fifth-end thereof coupled to the shutter circuit and a sixth-end thereof coupled to the ground.

8. The BJT pixel circuit according to claim 7, wherein during the exposure time, the shutter circuit is triggered to allow the storage capacitor to discharge through the emitter and the collector of the BJT transistor.

9. The BJT pixel circuit according to claim 7, wherein the shutter circuit comprises:

a first NMOS transistor, a drain of the first NMOS transistor coupled to a control terminal to receive a supply voltage, a source of the first NMOS transistor coupled to the feedback amplifier circuit, and the gate of the first NMOS transistor configured to receive the shutter signal; and a first PMOS transistor, a drain of the first PMOS transistor coupled to the source of the first NMOS transistor, a source of the first PMOS transistor coupled to the fifth-end of the storage capacitor, the gate of the first PMOS transistor configured to receive the shutter signal.

10. The BJT pixel circuit according to claim 9, wherein the feedback amplifier circuit comprises:

a second PMOS transistor, a source thereof coupled to a power terminal to receive an operating voltage, a gate thereof configured to receive a bias voltage;

a second NMOS transistor, having a drain thereof coupled to the source of the first NMOS transistor and the drain of the first PMOS transistor, a source thereof coupled to the emitter of the BJT transistor, and a gate thereof coupled to the drain of the second PMOS transistor; and a third NMOS transistor, a drain thereof coupled to a junction between the drain of the second PMOS transistor and the gate of the second NMOS transistor, a source thereof coupled to the ground, and the gate thereof coupled to the base of the BJT transistor and the first-end of the photodetector.

11. The BJT pixel circuit according to claim 1, wherein the current generating unit forms the second pulsed base current by injecting electron to the base of the BJT transistor upon receiving a falling edge of the trigger signal and causing the base voltage of the BJT transistor to drop.

12. The BJT pixel circuit according to claim 1, wherein the photodetector is a photodiode, the first-end being a cathode of the photodiode, the second-end being an anode of the photodiode.

13. An image sensor, adapted for an optical navigation device, comprising:

a light source, operative to illuminate a working surface of the optical navigation device according to a first control signal;

a pixel array, comprising a plurality of the BJT pixel circuits, for capturing an image corresponding to the working surface, each BJT pixel circuit comprising:

a BJT transistor, a collector thereof coupled to a ground;

a photodetector, having a first-end thereof coupled to a base of the BJT transistor, a second-end thereof coupled to the ground, the photodetector generating a first base current based on a light intensity of a light incident on the photodetector, wherein the light is a reflected light of the working surface illuminated by the light source;

a feedback amplifier circuit, coupled to the base of the BJT transistor and an emitter of the BJT transistor, operative to increase an emitter voltage of the BJT transistor according to the light intensity;

a shutter circuit, coupled to the feedback amplifier circuit, operative to control an exposure time of the photodetector according to a shutter signal; and a current generating unit, coupled to the base of the BJT transistor, generating a second pulsed base current to the base of the BJT transistor upon receiving a trigger signal;

wherein the current generating unit generates the second pulsed base current responsive to the trigger signal causing a base voltage of the BJT transistor to drop while the feedback amplifier circuit operates to increase the emitter voltage of the BJT transistor so as to build up the base-emitter voltage to a predetermined voltage level when the light source turns on; and a processor, respectively coupled to the BJT pixel circuits and the light source, generating the first control signal, the trigger signal, and the shutter signal, to control the operations of the light source, the current generating unit, and the shutter circuit, respectively according to a predetermined frame rate.

14. The image sensor according to claim 13, wherein the current generating unit comprises:
a coupling capacitor, having a third-end thereof coupled to the base of the BJT transistor and a fourth-end thereof configured to receive the trigger signal.

15. The image sensor according to claim 13, wherein the trigger signal is an active low pulse signal and the first control signal is an active high pulse signal, wherein the trigger signal is synchronized with the first control signal.

16. The image sensor according to claim 13, wherein the first control signal and the trigger signal are synchronized with the predetermined frame rate.

17. The image sensor according to claim 15, wherein the trigger signal has a predetermined pulse duration which is determined by a pre-flash time of the BJT transistor and the exposure time of the photodetector, and the exposure time begins after the pre-flash time, wherein the pre-flash time is the time required from the light source being turned on to the time that the BJT transistor operates with a stable beta.

18. The image sensor according to claim 15, wherein the pre-flash time is predetermined and stored in the processor.

19. The image sensor according to claim 15, wherein during the pre-flash time, the photodetector supplies the first base current to the base of the BJT transistor based on the light intensity of the light incident thereon while the current generating unit supplies the second pulsed base current responsive to a falling edge of the trigger signal to the base of the BJT transistor causing the base voltage of the BJT transistor to drop.

20. The image sensor according to claim 13, wherein the BJT pixel circuit further comprises:
a first storage capacitor, having a fifth-end thereof coupled to the shutter circuit and a sixth-end thereof coupled to the ground.

21. The image sensor according to claim 13, wherein the processor configures the exposing time of the shutter circuit based on the light intensity detected by the photodetector.

22. The image sensor according to claim 13, further comprising:
a second storage capacitor, having a seventh-end coupled to the plurality of the BJT pixel circuits and the processor, and an eighth-end coupled to the ground.

23. The image sensor according to claim 22, wherein the processor determines the exposing time of the shutter circuit of each pixel circuit based on the time required to discharge the second storage capacitor to a threshold voltage.

24. The image sensor according to claim 13, wherein the optical navigation device is an optical mouse.

25. A driving method of a BJT pixel circuit, the BJT pixel circuit comprising a photodetector, a BJT transistor, a feedback amplifier circuit, a shutter circuit, and a current generating unit, the driving method comprising:
turning on a light source to shine a light on the photodetector so as to generate a first base current to build a base voltage of the BJT transistor;
causing the current generating unit to generate a second pulsed base current upon receiving a falling edge of a trigger signal to lower the base voltage of the BJT transistor; and
driving the feedback amplifier circuit to increase an emitter voltage of the BJT transistor according to a light intensity of the light incident so as to increase a base-emitter voltage of the BJT transistor to a predetermined voltage level as the light source being turned on.

26. The driving method according to claim 25, wherein the trigger signal is an active low pulse signal and the trigger signal is synchronized with the turn-on duration of the light source.

27. The driving method according to claim 25, wherein before the step of turning on the light source and providing the trigger signal comprises:
determining a pre-flash time of the BJT transistor;
wherein the pre-flash time is the time required from the light source being turned on to the time that the BJT transistor operates with a stable beta.

28. The driving method according to claim 27, wherein after the step of increasing the base-emitter voltage of the BJT transistor to the predetermined voltage level comprises:
providing a shutter signal triggering the shutter circuit to begin an exposure time after the pre-flash time expired;
capturing an image data during the exposure time; and
switching the voltage level of the trigger signal to cause the current generating unit to generate another second pulsed base current;
turning off the light source.

29. The driving method according to claim 28, wherein the step before providing a shutter signal comprises:
detecting the light intensity of the light incident on the photodetector; and
determining the exposure time based on the light intensity of the light detected by the photodetector.

30. The driving method according to claim 28, wherein the exposure time begins after the pre-flash time.

* * * * *